United States Patent

Wu

(10) Patent No.: US 9,466,495 B2
(45) Date of Patent: Oct. 11, 2016

(54) CHEMICAL DIELECTRIC FORMATION FOR SEMICONDUCTOR DEVICE FABRICATION

(71) Applicant: Taiwan Semiconductor Manufacturing Company Limited, Hsinchu (TW)

(72) Inventor: Shao-Jyun Wu, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/739,045

(22) Filed: Jun. 15, 2015

(65) Prior Publication Data

US 2016/0027650 A1 Jan. 28, 2016

Related U.S. Application Data

(62) Division of application No. 14/028,799, filed on Sep. 17, 2013, now Pat. No. 9,059,092.

(51) Int. Cl.
| | | |
|---|---|---|
| H01L 21/00 | (2006.01) |
| H01L 21/28 | (2006.01) |
| H01L 21/02 | (2006.01) |
| H01L 21/8234 | (2006.01) |
| H01L 21/311 | (2006.01) |

(52) U.S. Cl.
CPC ... *H01L 21/28158* (2013.01); *H01L 21/02238* (2013.01); *H01L 21/02304* (2013.01); *H01L 21/02315* (2013.01); *H01L 21/31111* (2013.01); *H01L 21/31116* (2013.01); *H01L 21/31133* (2013.01); *H01L 21/31138* (2013.01); *H01L 21/823462* (2013.01)

(58) Field of Classification Search
None
See application file for complete search history.

(56) References Cited

U.S. PATENT DOCUMENTS

| | | | |
|---|---|---|---|
| 6,686,292 B1 * | 2/2004 | Yang | H01L 21/3065 257/E21.218 |
| 8,481,418 B2 | 7/2013 | Lee et al. | |
| 2001/0000629 A1 * | 5/2001 | Tsukamoto | H01L 21/28061 257/388 |
| 2002/0039843 A1 * | 4/2002 | Ikeda | H01L 21/31116 438/738 |
| 2004/0248338 A1 | 12/2004 | Sirringhaus et al. | |
| 2006/0073627 A1 * | 4/2006 | Park | B82Y 35/00 438/52 |
| 2006/0281320 A1 | 12/2006 | Lin et al. | |
| 2007/0166973 A1 * | 7/2007 | Rauf | H01L 21/02071 438/592 |
| 2013/0005147 A1 * | 1/2013 | Angyal | H01L 21/31116 438/692 |
| 2013/0017672 A1 * | 1/2013 | Kuboi | H01J 37/32082 438/477 |
| 2013/0295772 A1 | 11/2013 | Kim et al. | |
| 2014/0159239 A1 * | 6/2014 | Bossler | H01L 23/5384 257/741 |
| 2014/0199847 A1 | 7/2014 | Kasahara et al. | |
| 2014/0273521 A1 | 9/2014 | Wu et al. | |
| 2014/0330392 A1 * | 11/2014 | Schwartz | A61L 27/306 623/23.74 |
| 2015/0054059 A1 * | 2/2015 | Chen | H01L 21/28273 257/325 |

* cited by examiner

*Primary Examiner* — Evren Seven
(74) *Attorney, Agent, or Firm* — Jones Day

(57) ABSTRACT

Systems and methods are provided for fabricating semiconductor devices. For example, a substrate is provided. A polymer layer is formed on the substrate. An oxygen-based plasma is applied to remove the polymer layer. An oxidizing solution is applied to generate a dielectric layer. A conductive layer is formed on the dielectric layer.

21 Claims, 5 Drawing Sheets

CHEMICAL DIELECTRIC FORMATION FOR SEMICONDUCTOR DEVICE FABRICATION

CROSS-REFERENCE TO RELATED APPLICATIONS

This application is a divisional application of U.S. patent application Ser. No. 14/028,799, entitled "CHEMICAL DIELECTRIC FORMATION FOR SEMICONDUCTOR DEVICE FABRICATION" filed Sep. 17, 2013, which is incorporated herein by reference in its entirety.

FIELD

The technology described in this disclosure relates generally to material processing and more particularly to semiconductor device fabrication.

BACKGROUND

Fabrication of semiconductor devices often involves formation of a dielectric layer. For example, in order to make a metal-oxide-semiconductor (MOS) transistor, a gate oxide is generated on a substrate. Conventionally, gate oxides are sometimes formed using in situ steam generation, where pre-mixed $H_2$ and $O_2$, for example, are introduced to a process chamber to flow across a rotating substrate heated by tungsten-halogen lamps to generate oxides on the substrate.

An integrated circuit (IC) chip often includes core devices for performing certain functions and input/output (I/O) devices for communicating with external circuits. Transistors used for core devices and I/O devices are often different. For example, an I/O device usually has a relatively thick gate oxide in order to sustain a high voltage applied to the peripheral circuit. On the other hand, a core device often requires a very thin gate oxide to achieve a strong capacitive effect for lower threshold voltage and good current control. Using in-situ steam generation to fabricate gate oxides of core devices and I/O devices on a same IC chip often involves forming gate oxide layers with different thicknesses and multiple cleaning stages, which often results in high fabrication costs.

BRIEF DESCRIPTION OF THE DRAWINGS

FIG. 2(A) depicts an example diagram of a dielectric layer formed on a region of a substrate.

FIG. 2(B) depicts an example diagram of polysilicon formed on at least part of dielectric layer.

FIG. 2(C) depicts an example diagram of polysilicon removed from dielectric layer.

FIG. 2(D) depicts an example diagram of partial removal of second polymer layer.

FIG. 2(E) depicts an example diagram of de-scum process to remove part of first polymer layer.

FIG. 2(F) depicts an example diagram of all or part of dielectric layer removal.

FIG. 2(G) depicts an example diagram of oxidizing solution used to form another dielectric layer on core region.

DETAILED DESCRIPTION

Figure 1A:
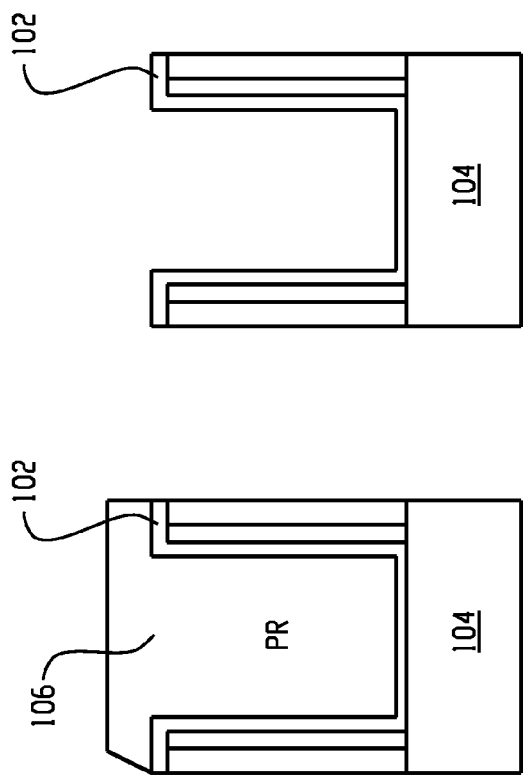
FIG. 1(A) depicts an example diagram of first and second polymer layers formed on a region of a substrate.
Figure 1B:
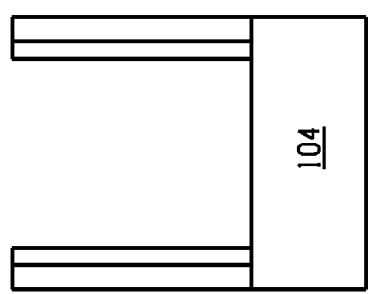
FIG. 1(B) depicts an example diagram of removal of second polymer layer.
Figure 1C:
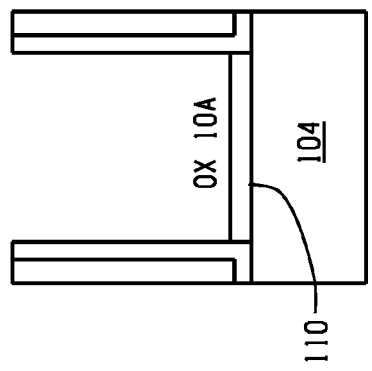
FIG. 1(C) depicts an example diagram of removal of first polymer layer.
Figure 1D:
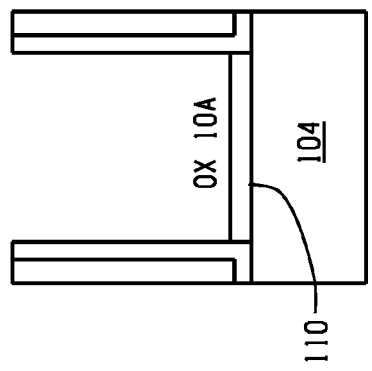
FIG. 1(D) depicts an example diagram of formation of a dielectric layer on a substrate.

FIGS. 1(A)-1(E) depict example diagrams showing a process of chemical formation of a dielectric layer on a substrate. As shown in FIG. 1(A), a first polymer layer 102, such as hexamethyldisilazane (HMDS), is formed on a particular region of a substrate 104 which includes one or more layers. Then, a second polymer layer 106, such as photo-resist, is formed on the first polymer layer 102. As shown in FIG. 1(B), the second polymer layer 106 is removed, e.g., with exposure to light and then a proper solvent. Thereafter, the first polymer layer 102 is removed using an oxygen-based plasma, as shown in FIG. 1(C). An oxidizing solution is applied to form a dielectric layer 110 (e.g., an oxide layer) on the particular region of the substrate 104, as shown in FIG. 1(D). In some embodiments, a conductive layer (e.g., polysilicon or metal materials) is formed on the dielectric layer 110 for fabrication of semiconductor devices. As an example, the conductive layer is used to form a gate stack of a transistor, where the dielectric layer serves as the gate dielectric of the transistor.

As an example, the substrate 104 includes one or more epitaxial layers. The substrate 104 is strained for performance enhancement, and/or includes a silicon-on-insulator (SOI) structure. In some embodiments, the first polymer layer 102 and the second polymer layer 106 are formed to define areas for subsequent fabrication of semiconductor devices (e.g., transistors). In an embodiment, the oxidizing solution is an acid solution including a mixture of sulfuric acid ($H_2SO_4$) and hydrogen peroxide ($H_2O_2$). In another embodiment, the oxidizing solution is a base solution including a mixture of ammonium hydroxide ($NH_4OH$) and hydrogen peroxide ($H_2O_2$). As an example, the oxidizing solution causes a rapid carbonization of organic materials (e.g., polymers) and dissolve the resulted carbon-containing materials.

Figure 2:
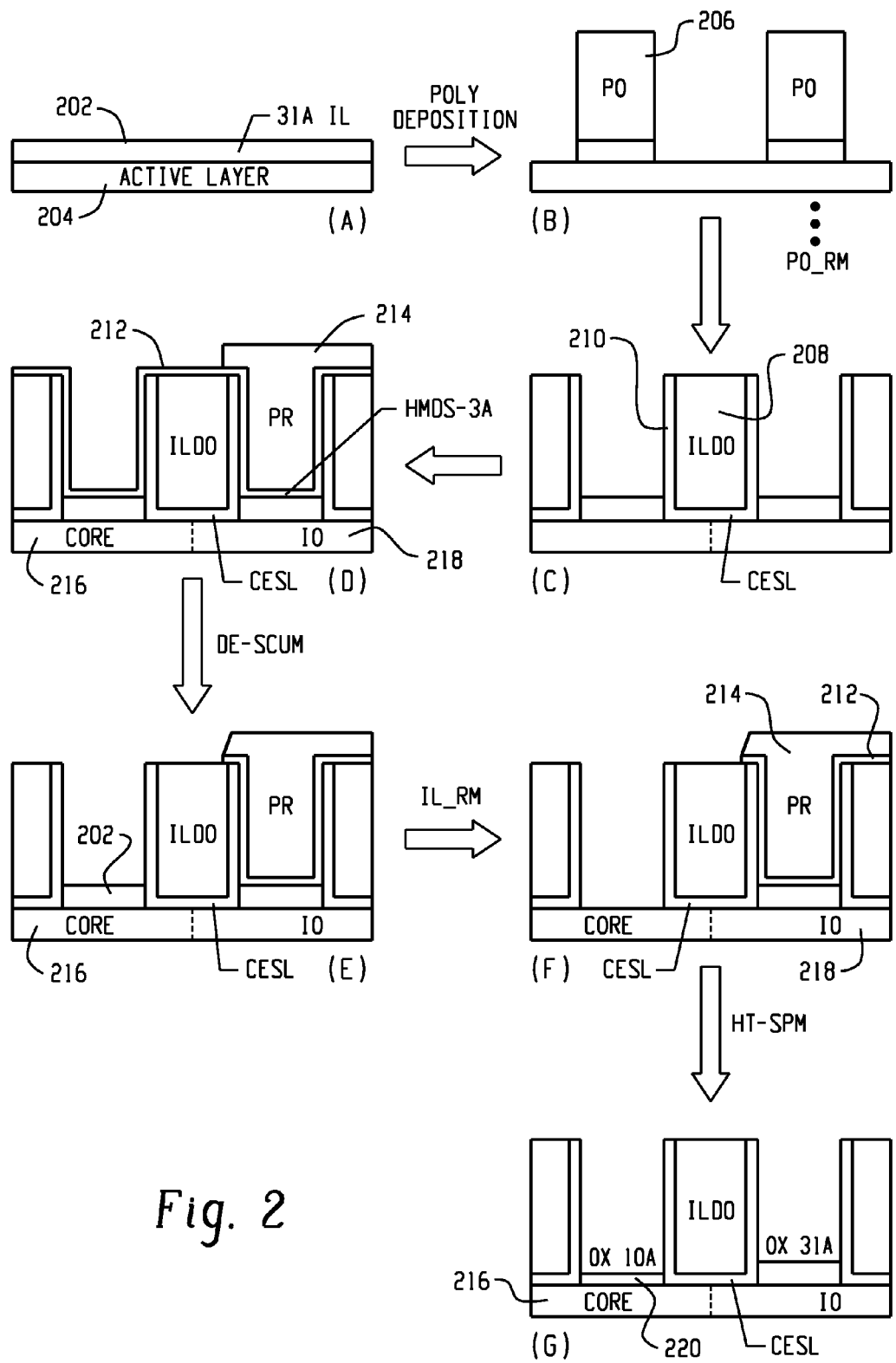
FIG. 2 depict example diagrams showing a process of chemical formation of a gate oxide for core devices.

FIGS. 2(A)-2(G) depict example diagrams showing a process of chemical formation of a gate oxide for core devices. As shown in FIG. 2(A), a dielectric layer 202 is formed on a particular region 204 (e.g., active region) of a substrate. For example, the dielectric layer 202 is patterned for subsequent device fabrication, and part of the dielectric layer 202 is removed. Dummy polysilicon 206 is formed on top of at least part of the dielectric layer 202, e.g., using chemical vapor deposition (CVD) or physical vapor deposition (PVD), as shown in FIG. 2(B). As an example, a spacer layer, a contact etch stop layer (CESL) 210, and/or an interlayer dielectric (ILD) layer 208 are formed on the substrate, and a chemical-mechanical polishing (CMP) process is implemented to remove at least part of the spacer, the CESL layer 210, and/or the ILD layer 208. As shown in FIG.

2(C), the dummy polysilicon 206 is removed, e.g., using dry etching or wet etching. A first polymer layer 212 (e.g., HMDS) and a second polymer layer 214 (e.g., photo-resist) are deposited on the substrate consecutively. Part of the second polymer layer 214 (e.g., photo-resist) on a core region 216 is removed, while part of the second polymer layer 214 on an I/O region 218 is kept, as shown in FIG. 2(D). For example, the core region 216 is used to fabricate core devices, and the I/O region 218 is used to fabricate I/O devices.

A de-scum process is performed using an oxygen-based plasma to remove part of the first polymer layer 212 (e.g., HMDS) on the core region, as shown in FIG. 2(E). Then, all or part of the dielectric layer 202 on the core region 216 is removed (e.g., through etching), as shown in FIG. 2(F). An oxidizing solution is implemented to remove both the second polymer layer 214 (e.g., photo-resist) and the first polymer layer 212 (e.g., HMDS) on the I/O region 218. In addition, the oxidizing solution is used to form another dielectric layer 220 on the core region 216, as shown in FIG. 2(G). In some embodiments, the thickness of the dielectric layer 220 in the core region 216 is different from that of the dielectric layer 202 in the I/O region 218. For example, the dielectric layer 202 has a thickness of about 3 nm, and the dielectric layer 220 (e.g., gate oxide) has a thickness of about 1 nm.

In some embodiments, a conductive layer (e.g., polysilicon or metal materials) is formed on the dielectric layer 202 for fabrication of I/O devices. As an example, the conductive layer is used to form a gate stack of an I/O device, where the dielectric layer 202 serves as the gate dielectric of the I/O device. In certain embodiments, a conductive layer (e.g., polysilicon or metal materials) is formed on the dielectric layer 220 for fabrication of core devices. As an example, the conductive layer is used to form a gate stack of a core device, where the dielectric layer 220 serves as the gate dielectric of the core device. The conductive layer for the I/O devices and the conductive layer for the core devices may be fabricated in a single process or in two separate processes respectively.

In an embodiment, the oxidizing solution is an acid solution including a mixture of sulfuric acid ($H_2SO_4$) and hydrogen peroxide ($H_2O_2$). In another embodiment, the oxidizing solution is a base solution including a mixture of ammonium hydroxide ($NH_4OH$) and hydrogen peroxide ($H_2O_2$). The oxidizing solution is applied at an elevated temperature, for example, in a range of about 160° C. to about 200° C.

Figure 3:
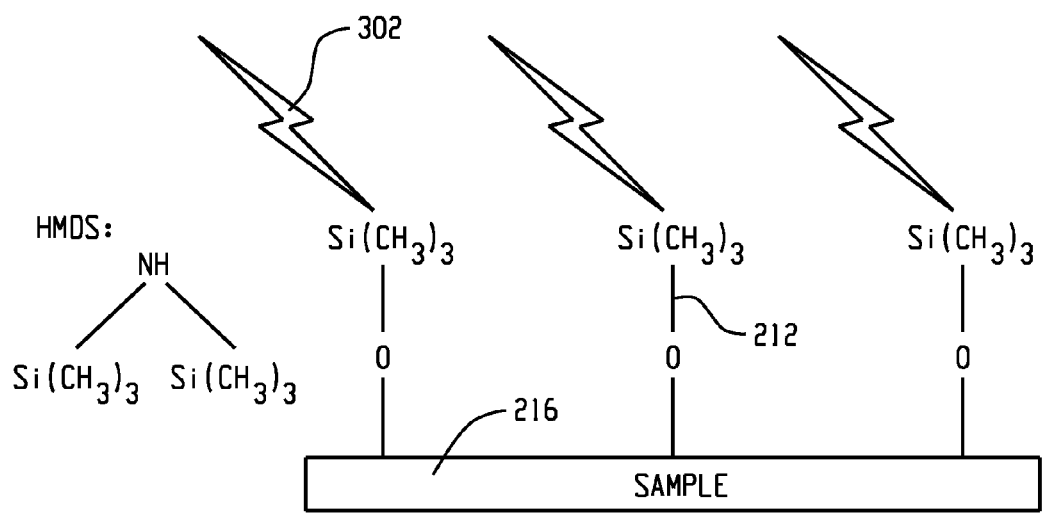
FIG. 3 depicts an example diagram of a de-scum process in which a HMDS layer is removed using an oxygen-based plasma.

FIG. 3 depicts an example diagram of the de-scum process in which the HMDS layer 212 is removed using the oxygen-based plasma. As shown in FIG. 3, the oxygen-based plasma 302 reacts with atoms/molecules within the HMDS layer 212 so that the HMDS layer 212 is removed. In some embodiments, an electrical field is applied to cause at least part of the oxygen-based plasma 302 that includes charged particles (e.g., oxygen ions) to move toward the substrate. The oxygen-based plasma 302 reacts, chemically or physically, with the HMDS layer 212. In an embodiment, the substrate is biased during the de-scum process. In another embodiment, the substrate is not biased during the de-scum process. In some embodiments, the de-scum process improves significantly the uniformity of the dielectric layer 220 (e.g., up to 97%).

Figure 4:
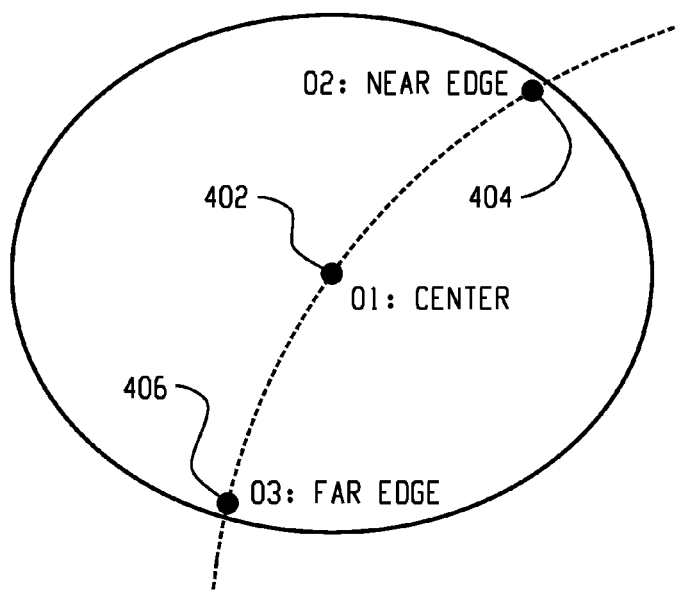
FIG. 4 depicts an example diagram of a substrate on which an oxidizing solution is applied.

FIG. 4 depicts an example diagram of a substrate on which the oxidizing solution is applied. In one embodiment, the oxidizing solution is applied in a center-dispense mode. For example, the oxidizing solution is applied at an elevated temperature for a predetermined time period (e.g., 60 seconds), at a center area 402 of the substrate to spread from the center area 402 to the other areas of the substrate. As an example, the substrate is rotating at a speed of about 50 revolutions-per-minute (rpm).

In another embodiment, the oxidizing solution is applied in a full-scan mode. For example, the oxidizing solution is applied from the center area 402 to an edge 404 of the substrate and from the edge 404 to another edge 406. Then, the oxidizing solution is applied from the edge 406 to the center area 402, and then from the center area 402 to the edge 404. The moving application of the oxidizing solution continues for a predetermined time period (e.g., 60 seconds). As an example, the substrate is rotating at a speed of about 300 revolutions-per-minute (rpm). In some embodiments, applying the oxidizing solution using the full-scan mode generates a more uniform dielectric layer (e.g., the oxide 220) than using the center-dispense mode.

In certain embodiments, the oxidizing solution is applied with a combination of the center-dispense mode and the full-scan mode. The order of applying these two modes and the respective time periods is adjusted to improve quality of the formed dielectric layer (e.g., the oxide 220). In some embodiments, applying the oxidizing solution using the combination of the center-dispense mode and the full-scan mode yields a thicker dielectric layer than using the center-dispense mode or the full-scan mode alone.

Figure 5:
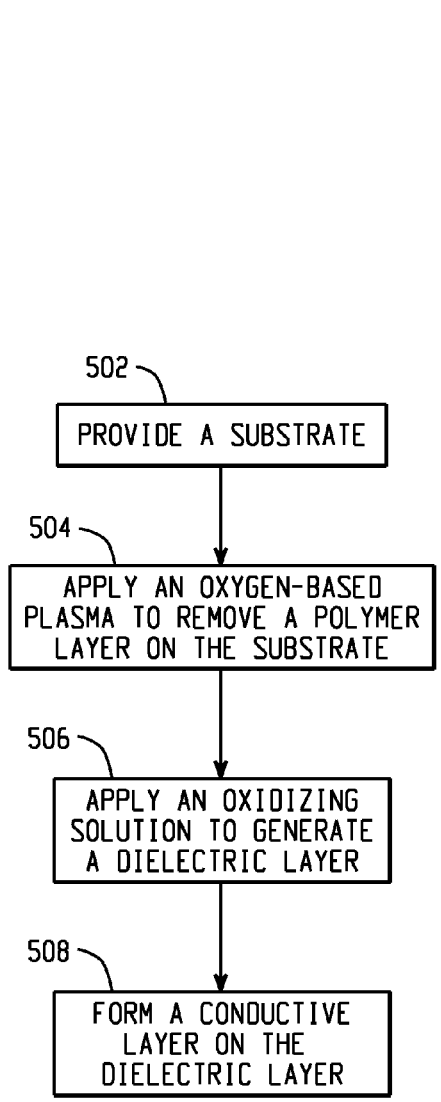
FIG. 5 depicts an example flow chart for chemical formation of a dielectric layer.

FIG. 5 depicts an example flow chart for chemical formation of a dielectric layer. At 502, a substrate is provided. A polymer layer is formed on the substrate. For example, the polymer layer includes a HMDS layer. At 504, an oxygen-based plasma is applied to remove the polymer layer. AT 506, an oxidizing solution is applied (e.g., at an elevated temperature) to generate a dielectric layer. At 508, a conductive layer (e.g., polysilicon or metal materials) is formed on the dielectric layer for fabrication of semiconductor devices. As an example, the conductive layer is used to form a gate stack of a transistor, where the dielectric layer serves as the gate dielectric of the transistor. In an embodiment, the oxidizing solution is an acid solution including a mixture of sulfuric acid ($H_2SO_4$) and hydrogen peroxide ($H_2O_2$). In another embodiment, the oxidizing solution is a base solution including a mixture of ammonium hydroxide ($NH_4OH$) and hydrogen peroxide ($H_2O_2$).

Figure 6:
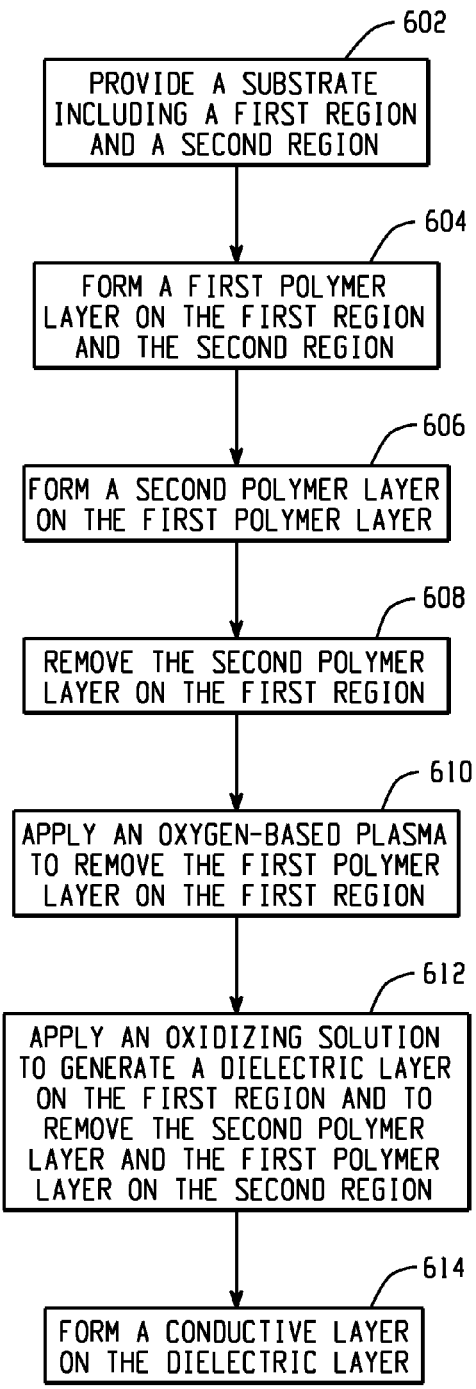
FIG. 6 depicts another example flow chart for chemical formation of a dielectric layer.

FIG. 6 depicts another example flow chart for chemical formation of a dielectric layer. At 602, a substrate including a first region and a second region is provided. For example, the first region is used to fabricate core devices, and the second region is used to fabricate I/O devices. At 604, a first polymer layer is formed on the first region and the second region. For example, the first polymer layer includes HMDS. At 606, a second polymer layer is formed on the first polymer layer. For example, the second polymer layer includes photo-resist. At 608, the second polymer layer on the first region is removed. An oxygen-based plasma is applied to remove the first polymer layer on the first region, at 610. At 612, an oxidizing solution is applied to generate a dielectric layer (e.g., silicon dioxide) on the first region and to remove the second polymer layer and the first polymer layer on the second region. At 614, a conductive layer (e.g., polysilicon or metal materials) is formed on the dielectric layer (e.g., on the first region). As an example, the conductive layer is used to form a gate stack of a core device, where the dielectric layer serves as the gate dielectric of the core device. In an embodiment, the oxidizing solution is an acid solution including a mixture of sulfuric acid ($H_2SO_4$) and hydrogen peroxide ($H_2O_2$). In another embodiment, the oxidizing solution is a base solution including a mixture of ammonium hydroxide (NH$_4$OH) and hydrogen peroxide (H$_2$O$_2$).

Figure 7:
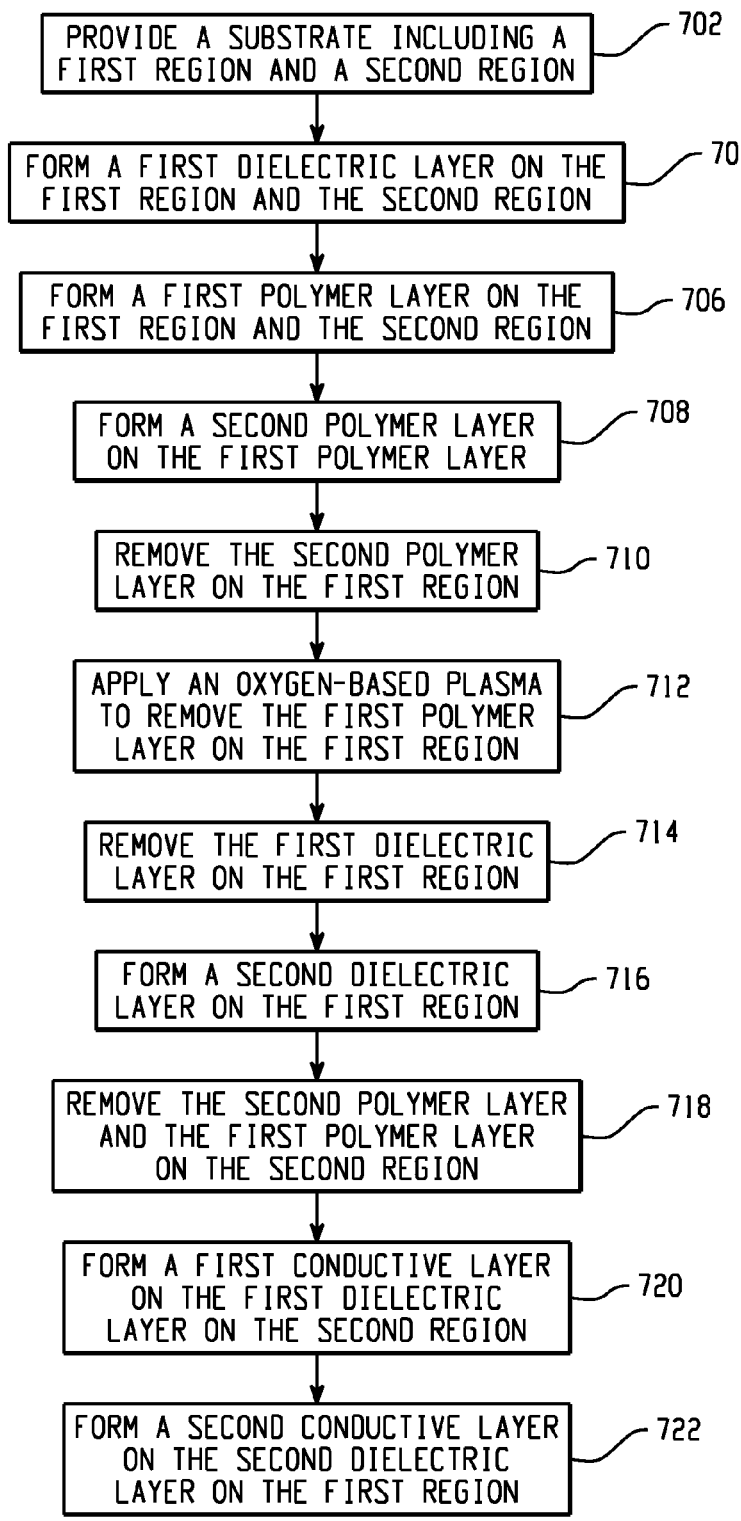
FIG. 7 depicts yet another example flow chart for chemical formation of a dielectric layer.

FIG. 7 depicts yet another example flow chart for chemical formation of a dielectric layer. At 702, a substrate including a first region and a second region is provided. For example, the first region and the second region are used to fabricate core devices and I/O devices respectively. At 704, a first dielectric layer (e.g., silicon oxide) is formed on the first region and the second region. For example, the first dielectric layer has a first thickness. At 706, a first polymer layer is formed on the first region and the second region. For example, the first polymer layer includes HMDS. A second polymer layer is formed on the first polymer layer at 708. For example, the second polymer layer includes photoresist. At 710, the second polymer layer on the first region is removed.

At 712, an oxygen-based plasma is applied to remove the first polymer layer on the first region. The first dielectric layer on the first region is removed, at 714. For example, the first dielectric layer remains on the second region. At 716, a second dielectric layer is formed on the first region. For example, the second dielectric layer has a second thickness different from the first thickness. At 718, the second polymer layer and the first polymer layer on the second region are removed (e.g., consecutively). At 720, a first conductive layer (e.g., polysilicon or metal materials) is formed on the first dielectric layer on the second region for fabricating one or more first devices (e.g., I/O devices). At 722, a second conductive layer (e.g., polysilicon or metal materials) is formed on the second dielectric layer on the first region for fabricating one or more second devices (e.g., core devices).

In some embodiments, the first conductive layer is used to form a gate stack of an I/O transistor, where the first dielectric layer serves as the gate dielectric of the I/O transistor. In certain embodiments, the second conductive layer is used to form a gate stack of a core transistor, where the second dielectric layer serves as the gate dielectric of the core transistor. As an example, the first conductive layer and the second conductive layer are fabricated in a single process or in two separate processes respectively.

In accordance with the teachings described herein, systems and methods are provided for fabricating semiconductor devices. For example, a substrate is provided. A polymer layer is formed on the substrate. An oxygen-based plasma is applied to remove the polymer layer. An oxidizing solution is applied to generate a dielectric layer for fabricating semiconductor devices. A conductive layer is formed on the dielectric layer for fabricating semiconductor devices.

In one embodiment, a method for fabricating semiconductor devices is provided. For example, a substrate including a first region and a second region is provided. A first polymer layer is formed on the first region and the second region. A second polymer layer is formed on the first polymer layer. The second polymer layer is removed on the first region. An oxygen-based plasma is applied to remove the first polymer layer on the first region. An oxidizing solution is applied to generate a first dielectric layer on the first region and to remove the second polymer layer and the first polymer layer on the second region. A conductive layer is formed on the first dielectric layer for fabricating one or more devices.

In another embodiment, a method for fabricating semiconductor devices is provided. For example, a substrate including a first region and a second region is provided. A first dielectric layer is formed on the first region and the second region, the first dielectric layer having a first thickness. A first polymer layer is formed on the first region and the second region. A second polymer layer is formed on the first polymer layer. The second polymer layer on the first region is removed. An oxygen-based plasma is applied to remove the first polymer layer on the first region. The first dielectric layer on the first region is removed. A second dielectric layer is formed on the first region. The second dielectric layer has a second thickness different from the first thickness. The second polymer layer and the first polymer layer on the second region are removed. A first conductive layer is formed on the first dielectric layer on the second region for fabricating one or more first devices. A second conductive layer is formed on the second dielectric layer on the first region for fabricating one or more second devices.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as top, first, second, etc. that are used for descriptive purposes only and are not to be construed as limiting. For example, the term "on" as used herein (including in the claims) may not indicate that a first layer "on" a second layer is directly on and in immediate contact with the second layer unless such is specifically stated; there may be a third layer or other structure between the first layer and the second layer on the first layer. The term "substrate" may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials).

What is claimed is:
1. A method for fabricating semiconductor devices, the method comprising:
providing a substrate, depositing an interlayer dielectric on the substrate, forming trenches in the interlayer dielectric to expose a first region of the substrate, and then providing a polymer layer on the first region on the substrate;

applying an oxygen-based plasma to remove the polymer layer from the first region;

applying an oxidizing solution to generate a dielectric layer on the first region after the removal of the polymer layer; and forming a conductive layer on the dielectric layer.

2. The method of claim 1, further comprising:

forming the conductive layer for fabricating a gate stack of a transistor; and generating the dielectric layer as a gate dielectric of the transistor.

3. The method of claim 1, wherein applying the oxidizing solution comprises applying a mixture of sulfuric acid and hydrogen peroxide.

4. The method of claim 1, wherein applying the oxidizing solution comprises applying a mixture of ammonium hydroxide and hydrogen peroxide.

5. The method of claim 1, wherein applying the oxidizing solution comprises applying the oxidizing solution at a center of the substrate for a predetermined time period.

6. The method of claim 1, wherein applying the oxidizing solution comprises applying the oxidizing solution at different areas of the substrate for a predetermined time period.

7. The method of claim 6, wherein applying the oxidizing solution at different areas of the substrate for the predetermined time period comprises:

applying the oxidizing solution from a center of the substrate to a first edge of the substrate;

applying the oxidizing solution from the first edge of the substrate to a second edge of the substrate; and applying the oxidizing solution from the second edge of the substrate to the center of the substrate.

8. The method of claim 1, wherein applying the oxidizing solution to generate the dielectric layer further comprises providing the dielectric layer with a thickness of about 1 nm.

9. A method for fabricating semiconductor devices, the method comprising:

providing a substrate, depositing an interlayer dielectric on the substrate, forming trenches in the interlayer dielectric to expose a first region of the substrate, and then providing a polymer layer on the first region on the substrate;

applying an oxygen-based plasma to remove the polymer layer from the first region;

applying an oxidizing solution to generate a gate dielectric of a transistor on the first region after the removal of the polymer layer; and forming a gate stack of the transistor on the gate dielectric.

10. The method of claim 9, wherein applying the oxidizing solution comprises applying a mixture of sulfuric acid and hydrogen peroxide.

11. The method of claim 9, wherein applying the oxidizing solution comprises applying a mixture of ammonium hydroxide and hydrogen peroxide.

12. The method of claim 9, wherein applying the oxidizing solution comprises applying the oxidizing solution at a center of the substrate for a predetermined time period.

13. The method of claim 9, wherein applying an oxidizing solution comprises applying the oxidizing solution at different areas of the substrate for a predetermined time period.

14. The method of claim 13, wherein applying the oxidizing solution at different areas of the substrate for the predetermined time period comprises:

applying the oxidizing solution from a center of the substrate to a first edge of the substrate;

applying the oxidizing solution from the first edge of the substrate to a second edge of the substrate; and applying the oxidizing solution from the second edge of the substrate to the center of the substrate.

15. The method of claim 9, wherein applying the oxidizing solution to generate the gate dielectric further comprises providing the gate dielectric with a thickness of about 1 nm.

16. A method for fabricating semiconductor devices, the method comprising:

providing a substrate, depositing an interlayer dielectric on the substrate, forming trenches in the interlayer dielectric to expose a first region of the substrate, and then providing a polymer layer on the first region on the substrate;

applying an oxygen-based plasma to remove the polymer layer from the first region;

applying an oxidizing solution to generate a dielectric layer on the first region as a gate dielectric of a transistor at different areas of the substrate for a predetermined time period, wherein the dielectric layer is generated after the removal of the polymer layer; and forming a conductive layer on the dielectric layer as a gate stack of the transistor.

17. The method of claim 16, wherein applying the oxidizing solution comprises applying a mixture of sulfuric acid and hydrogen peroxide.

18. The method of claim 16, wherein applying the oxidizing solution comprises applying a mixture of ammonium hydroxide and hydrogen peroxide.

19. The method of claim 16, wherein applying the oxidizing solution at different areas of the substrate for the predetermined time period comprises:

applying the oxidizing solution from a center of the substrate to a first edge of the substrate;

applying the oxidizing solution from the first edge of the substrate to a second edge of the substrate; and applying the oxidizing solution from the second edge of the substrate to the center of the substrate.

20. The method of claim 16, wherein applying the oxidizing solution to generate the dielectric layer comprises providing the dielectric layer with a thickness of about 1 nm.

21. A method for fabricating semiconductor devices, the method comprising:

providing a substrate, depositing an interlayer dielectric on the substrate, forming trenches in the interlayer dielectric to expose a first region of the substrate, and then forming a first polymer layer on the first region on the substrate;

forming a second polymer layer on the first polymer layer;

removing the second polymer layer;

applying an oxygen-based plasma to remove the first polymer layer from the first region;

applying an oxidizing solution to generate a dielectric layer on the first region after the removal of the first polymer layer; and forming a conductive layer on the dielectric layer.

* * * * *